US012704471B2

(12) United States Patent
Cohen et al.

(10) Patent No.: US 12,704,471 B2
(45) Date of Patent: Aug. 11, 2026

(54) CONCENTRATION DETERMINATION USING SINGLE-PEAK NMR SPECTRA

(71) Applicant: 4IR Solutions Ltd., Or-Akiva (IL)

(72) Inventors: Tal Cohen, Herzliya (IL); Paul J. Giammatteo, Southbury, CT (US); Mordechai Bercovici, Kiryat (IL)

(73) Assignee: 4IR Solutions Ltd., Or-Akiva (IL)

( * ) Notice: Subject to any disclaimer, the term of this patent is extended or adjusted under 35 U.S.C. 154(b) by 0 days.

(21) Appl. No.: 19/210,630

(22) Filed: May 16, 2025

(65) Prior Publication Data

US 2025/0362257 A1 Nov. 27, 2025

Related U.S. Application Data

(60) Provisional application No. 63/650,381, filed on May 21, 2024, provisional application No. 63/650,387, filed on May 21, 2024.

(51) Int. Cl.
*G01V 3/00* (2006.01)
*G01N 24/08* (2006.01)
(Continued)

(52) U.S. Cl.
CPC ......... *G01N 24/085* (2013.01); *G01N 24/082* (2013.01); *G01R 33/307* (2013.01); *G01R 33/383* (2013.01)

(58) Field of Classification Search
CPC .. G01N 24/085; G01N 24/082; G01R 33/307; G01R 33/383
(Continued)

(56) References Cited

U.S. PATENT DOCUMENTS

2003/0206020 A1 11/2003 Cohen et al.
2016/0003753 A1 1/2016 Augustine et al.
2021/0341325 A1 11/2021 Bayer

FOREIGN PATENT DOCUMENTS

EP 3896437 A1 * 10/2021 ........... G01N 24/081

* cited by examiner

*Primary Examiner* — Walter L Lindsay, Jr.
*Assistant Examiner* — Frederick Wenderoth
(74) *Attorney, Agent, or Firm* — Reches Patents

(57) ABSTRACT

A method for production line nuclear magnetic resonance (NMR) measurement of a fluid comprising a material having a single resonance frequency, the method includes: (a) positioning a reference sample comprising the material and a sample of the fluid within a sensing region of an NMR measurement unit coil of a production line NMR measurement device, and within a magnetic field of a permanent magnet of the production line NMR measurement device, wherein a concentration of the material within the reference sample is of a known value; (b) performing an NMR measurement comprising feeding at least one radio frequency coil of the production line NMR measurement device with a signal having a spectrum that comprises a characteristic frequency of a nucleus of the material, and generating detection signals indicative of sensed radio frequency emissions associated with the reference sample and the sample of the fluid; (c) processing the detection signals to provide an NMR spectrum comprising a first peak associated with the material within the reference sample and a second peak associated with the material within the fluid; and (d) determining a concentration of the material within the fluid based on a relationship between an attribute of the first peak, an attribute of the second peak and the known value.

20 Claims, 5 Drawing Sheets

(51) Int. Cl.
*G01R 33/30* (2006.01)
*G01R 33/383* (2006.01)
(58) Field of Classification Search
USPC .......................................................... 324/306
See application file for complete search history.

(B)

(C)

CONCENTRATION DETERMINATION USING SINGLE-PEAK NMR SPECTRA

CROSS-REFERENCE TO RELATED APPLICATIONS

This application claims priority of U.S. Provisional patent No. 63/650,381 filing date May 21, 2024, which is hereby incorporated in its entirety.

This application claims priority of U.S. Provisional patent No. 63/650,387 filing date May 21, 2024, which is hereby incorporated in its entirety.

FIELD OF INVENTION

The present disclosure relates to nuclear magnetic resonance (NMR) spectroscopy, and more particularly to a method and system for determining the concentration of elements with single-peak NMR spectra using a reference sample.

BACKGROUND

Nuclear magnetic resonance (NMR) spectroscopy is a powerful analytical technique used to determine the structure, dynamics, and chemical environment of molecules. This method relies on the interaction between atomic nuclei and magnetic fields to provide detailed information about the composition and properties of various substances.

In NMR spectroscopy, each element or molecule exhibits a characteristic resonance frequency when subjected to a strong magnetic field. The resulting NMR spectrum displays peaks corresponding to these resonance frequencies, allowing researchers and analysts to identify and quantify different chemical species within a sample.

Traditionally, the determination of element concentrations using NMR spectroscopy involves comparing the integrals of multiple peaks associated with the same material. This approach works well for compounds containing multiple chemically distinct nuclei, as it provides multiple reference points for concentration calculations.

However, challenges arise when analyzing elements that produce only a single peak in their NMR spectra, such as lithium, boron, or sodium. In these cases, the lack of additional peaks for comparison makes it difficult to accurately determine concentrations, especially when high precision is required.

The integral of a single peak in an NMR spectrum can be influenced by various factors, including magnetic field adjustments and the responses of the receiver and transmitter components. These elements may exhibit minor variations over time and with changes in temperature, introducing instability into the NMR system and potentially affecting the accuracy of concentration measurements.

As industrial and research applications increasingly demand precise quantification of elements with single-peak NMR spectra, there is a growing need for improved methods and systems to address the limitations of conventional NMR concentration determination techniques. Enhancing the accuracy and reliability of these measurements could have wide-ranging implications across fields such as materials science, chemical engineering, and pharmaceutical research.

SUMMARY

This summary is provided to introduce a selection of concepts in a simplified form that are further described below in the detailed description. This summary is not intended to identify key features or essential features of the claimed subject matter, nor is it intended to be used as an aid in determining the scope of the claimed subject matter.

According to an aspect of the present disclosure, a method for production line nuclear magnetic resonance (NMR) measurement of a fluid that comprises a material having a single resonance frequency is provided. The method includes positioning a reference sample that comprises the material and a sample of the fluid within a sensing region of an NMR measurement unit coil of a production line NMR measurement device, and within a magnetic field of a permanent magnet of the production line NMR measurement device. The concentration of the material within the reference sample is of a known value. The method further includes performing an NMR measurement that comprises feeding at least one radio frequency coil of the production line NMR measurement device with a signal having a spectrum that comprises a characteristic frequency of a nucleus of the material, and generating detection signals indicative of sensed radio frequency emissions associated with the reference sample and the sample of the fluid. The method also includes processing the detection signals to provide an NMR spectrum that comprises a first peak associated with the material within the reference sample and a second peak associated with the material within the fluid. Additionally, the method includes determining a concentration of the material within the fluid based on a relationship between an attribute of the first peak, an attribute of the second peak and the known value.

According to other aspects of the present disclosure, the method may include one or more of the following features. The reference sample may be positioned within a reference sample housing. The reference sample may be positioned within a capillary housing. The reference sample and a fluid conduit that holds the housing may be surrounded by a single radio frequency coil of the at least one radio frequency coil. A fluid conduit that holds the housing may be surrounded by the single radio frequency coil and the reference sample may be located outside the single radio frequency coil. The at least one radio frequency coil may include a first radio frequency coil that surrounds the fluid conduit and a second radio frequency coil that surrounds the reference sample. The attribute of the first peak may be an area associated with the first peak, and the attribute of the second peak may be an area associated with the second peak. The determining of the concentration may comprise multiplying the known value by a ratio between the area of the second peak and the area of the first peak.

The foregoing general description of the illustrative embodiments and the following detailed description thereof are merely exemplary aspects of the teachings of this disclosure and are not restrictive.

BRIEF DESCRIPTION OF FIGURES

Non-limiting and non-exhaustive examples are described with reference to the following figures.

Non-limiting and non-exhaustive examples are described with reference to the following figures.

DETAILED DESCRIPTION

The following description sets forth exemplary aspects of the present disclosure. It should be recognized, however, that such description is not intended as a limitation on the scope of the present disclosure. Rather, the description also encompasses combinations and modifications to those exemplary aspects described herein.

The present disclosure relates to a method for production line NMR measurement of a fluid containing a material with a single resonance frequency.

An example of a production line NMR measurement system is the Process NMR AI-60 of 4IRsolutions Ltd., of Israel.

Using a reference housing with one or more reference materials, wherein the reference housing is positioned outside a fluid conduit (or fluid housing) that holds a sample of the fluid to be evaluated—is highly beneficial in production lines—as the measuring entity may not have access to the fluid and/or is prevented from adding the reference material to the fluid, and the like. The usage of said reference housing outside the fluid conduit simplifies the evaluation process as there is no need to add reference material to the fluid, and also prevents unwanted contamination with reference material.

Figure 1:
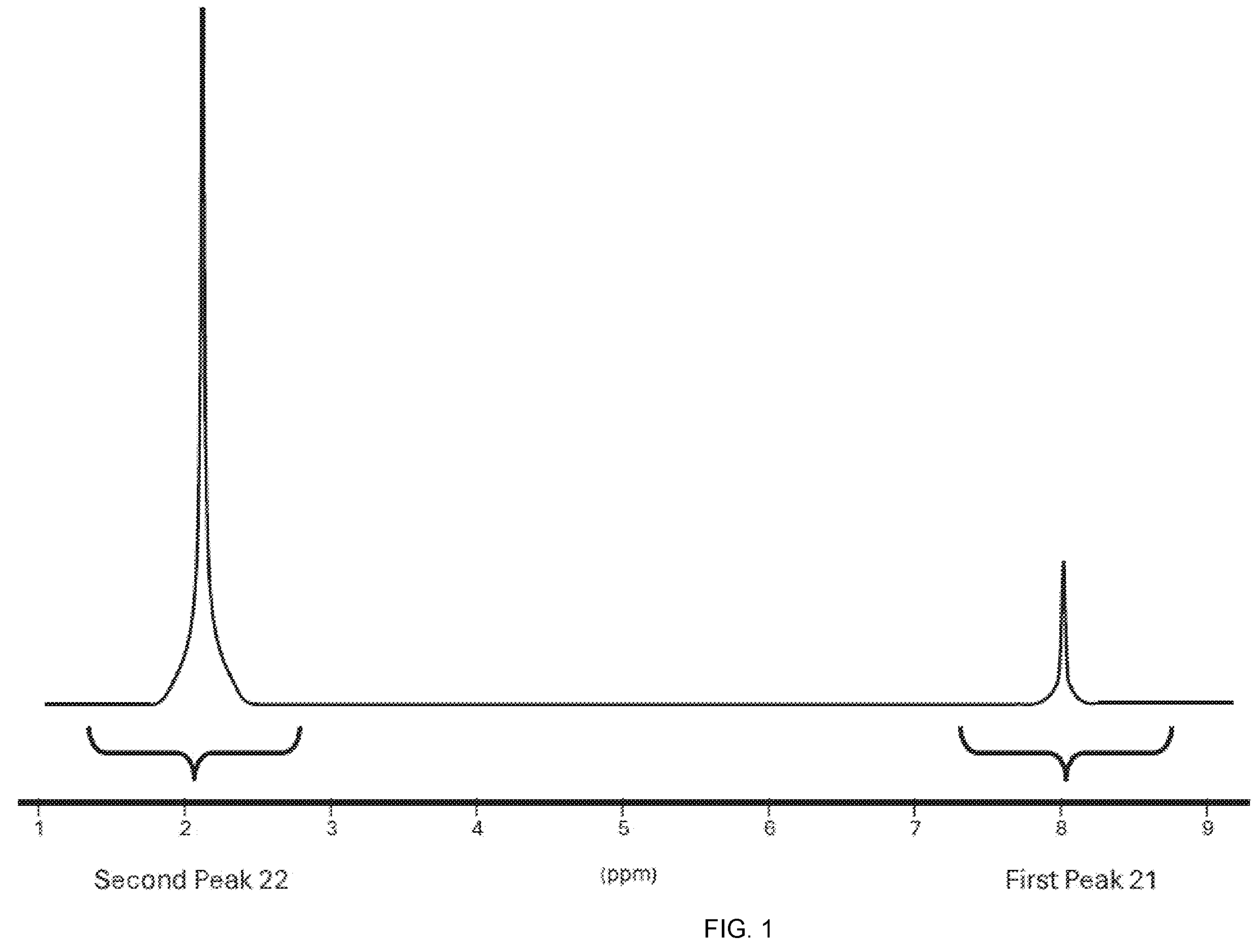
FIG. 1 illustrates a flowchart of a method for production line nuclear magnetic resonance (NMR) measurement of a fluid containing a material with a single resonance frequency.

FIG. 1 illustrates a flowchart of a method 10 for performing such measurements.

According to an embodiment, the method 10 may address challenges associated with analyzing NMR spectra that contain only a single peak, which can occur when measuring elements such as lithium, boron, or sodium. The method 10 may enable accurate concentration determination of these elements by utilizing a reference sample with a known concentration.

The method 10 may include several steps. A step 12 may involve positioning a reference sample and a sample of the fluid within a sensing region of an NMR measurement unit coil and within a magnetic field of a permanent magnet. A step 14 may comprise performing an NMR measurement by feeding at least one radio frequency coil with a signal having a spectrum that includes a characteristic frequency of a nucleus of the material being measured. This step may also generate detection signals indicative of sensed radio frequency emissions associated with both the reference sample and the fluid sample.

A step 16 may involve processing the detection signals to provide an NMR spectrum. This spectrum may comprise a first peak associated with the material within the reference sample and a second peak associated with the material within the fluid. Finally, a step 18 may determine the concentration of the material within the fluid based on a relationship between attributes of the first and second peaks and the known concentration value of the reference sample.

According to an embodiment, the concentration determination may involve multiplying the known value of the reference sample concentration by a ratio between the area of the second peak and the area of the first peak. This approach may allow for accurate concentration measurements even when dealing with materials that produce only a single peak in their NMR spectra.

Figure 2:
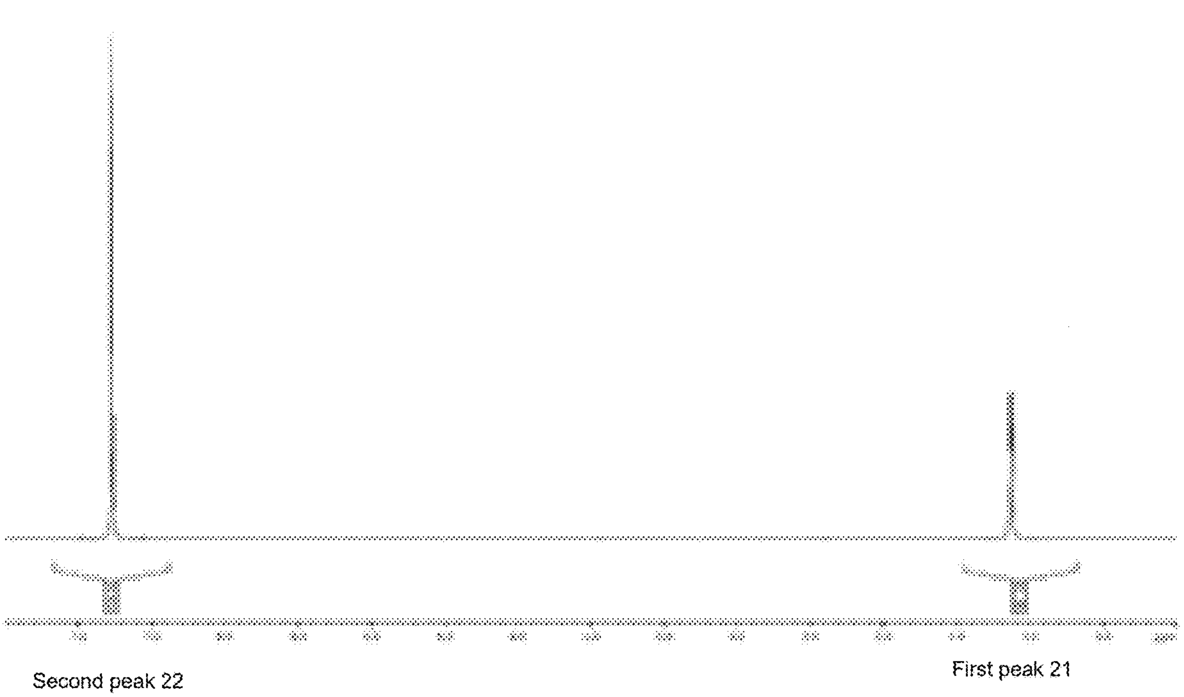
FIG. 2 depicts an NMR spectrum showing two distinct peaks associated with the material in the reference sample and the fluid sample.

FIG. 2 illustrates an NMR spectrum obtained from the method 10 for production line nuclear magnetic resonance (NMR) measurement of a fluid comprising a material having a single resonance frequency. The NMR spectrum may include a first peak 21 associated with the material within the reference sample and a second peak 22 associated with the material within the fluid sample.

In some cases, the first peak 21 and the second peak 22 may appear at different positions along the frequency axis of the NMR spectrum. This difference in position may be due to the slight variation in the magnetic field experienced by the reference sample and the fluid sample within the NMR measurement device.

The frequency shift between the first and second peaks result from sensing different magnetic fields, which results from its distinct physical location of the reference housing and the fluid conduit.

The first peak 21 and the second peak 22 may each have attributes that can be analyzed to determine the concentration of the material in the fluid sample. In some cases, an attribute of the first peak 21 and an attribute of the second peak 22 may be an area associated with each peak. The area under each peak may be proportional to the number of nuclei of the material present in the respective sample.

In some cases, the concentration of the material in the fluid sample may be determined based on a relationship between the area of the first peak 21, the area of the second peak 22, and the known concentration value of the reference sample. For example, the concentration of the material in the fluid sample may be calculated by multiplying the known concentration value of the reference sample by a ratio of the area of the second peak 22 to the area of the first peak 21.

This approach may allow for accurate concentration measurements of materials that produce only a single peak in their NMR spectra, such as lithium, boron, or sodium. By using the reference sample with a known concentration, the method 10 may account for variations in the NMR system response and provide more precise concentration determinations.

Figure 3:
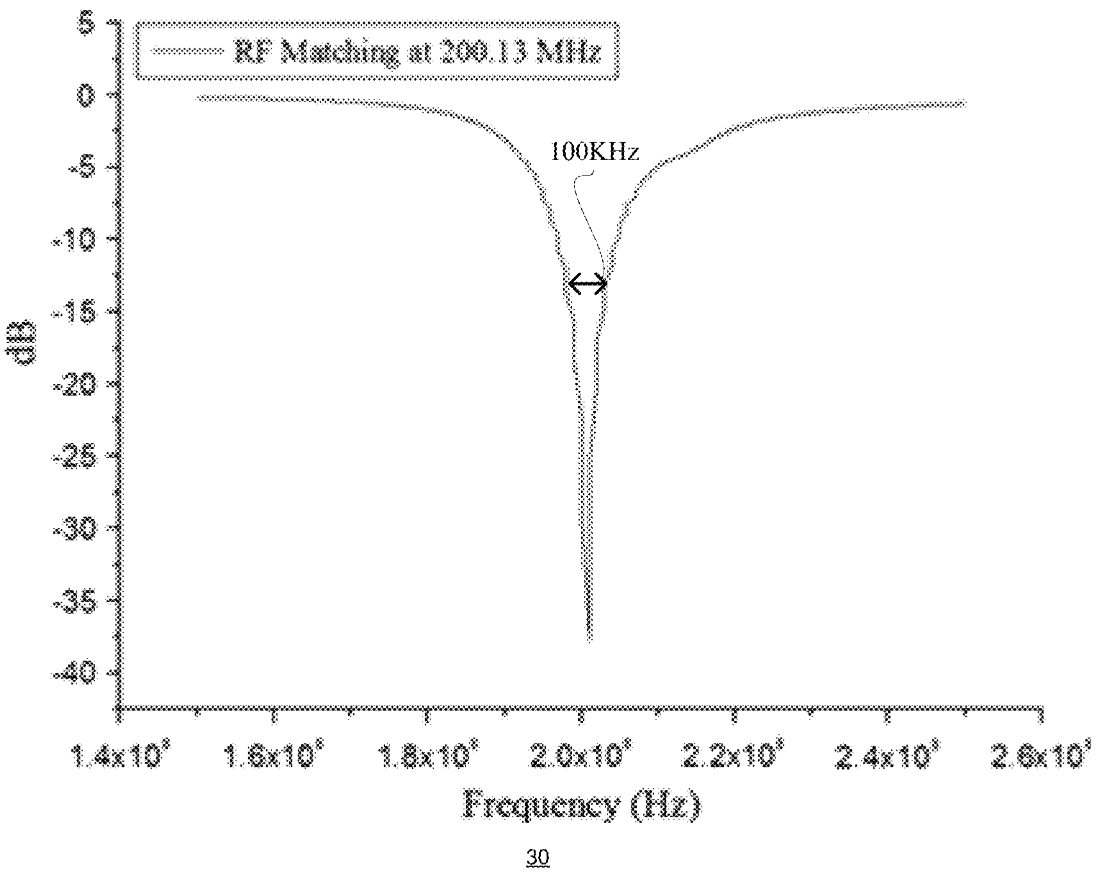
FIG. 3 shows a graph of RF matching characteristics at 200.13 MHz, displaying the frequency response curve for the NMR measurement system.

FIG. 3 illustrates a graph showing an RF bandpass filter having a characteristics at 200.13 MHz for the NMR measurement system. The graph displays the frequency response curve plotted with frequency (Hz) on the x-axis ranging from $1.4\times10^7$ to $2.6\times10^7$ Hz and signal strength (dB) on the y-axis ranging from −40 to 5 dB. A page number 30 is visible in the upper right corner of the figure.

The response curve in FIG. 3 shows a sharp resonance dip centered around $2.0\times10^7$ Hz, reaching approximately −37 dB at its lowest point. A bandwidth marker indicates a 100 KHz span across the resonance feature where the response is below −10 dB. The curve exhibits a symmetric shape with steep slopes on both sides of the central resonance frequency.

In some cases, the RF band pass frequency response may be crucial for the NMR measurement system to detect both the first peak and the second peak associated with the reference sample and the fluid sample, respectively. The frequency response of the RF band pass covers the bandwidth of the RF coil that may be engineered and adjusted to ensure that the RF coil can respond effectively to the frequencies of both the reference sample (which may be contained in a capillary) and the main fluid sample.

The band pass filter frequency response is adjustable and may be tailored to one or more oscillation frequencies associated one or more material within the reference sample (and in the fluid) that are being measured. If a plurality of materials are searched (for example when having one or more reference housing for storing one or more reference materials (for example three materials such as Lithium, Boron, and Sodium)—then the band pass filter frequency response is adjusted a multiple times to properly pass the oscillation frequencies associated with the plurality of materials.

A single reference housing may be configured to store two or more reference materials.

According to an embodiment the band pass filter frequency response is scanned over one or more frequencies region of interest to provide one or more spectra.

The bandwidth of the RF coil, as indicated by the 100 KHz span in FIG. 3, may be designed to be wide enough to encompass the slight frequency difference between the first peak and the second peak. This frequency difference may arise due to the variation in the magnetic field experienced by the reference sample and the fluid sample within the NMR measurement device.

In some cases, the steep slopes of the response curve on either side of the central resonance frequency may help to ensure good sensitivity and selectivity in detecting the NMR signals from both the reference sample and the fluid sample. The depth of the resonance dip (approximately −37 dB) may indicate strong coupling between the RF coil and the nuclear spins in the samples, which may contribute to improved signal-to-noise ratio in the NMR measurements.

The symmetric shape of the response curve may be beneficial for maintaining consistent sensitivity across the frequency range where the first peak and the second peak are expected to appear. This consistency may contribute to the accuracy of the concentration determination performed in step 18 of the method 10, which relies on comparing attributes of the first peak and the second peak.

Figure 4:
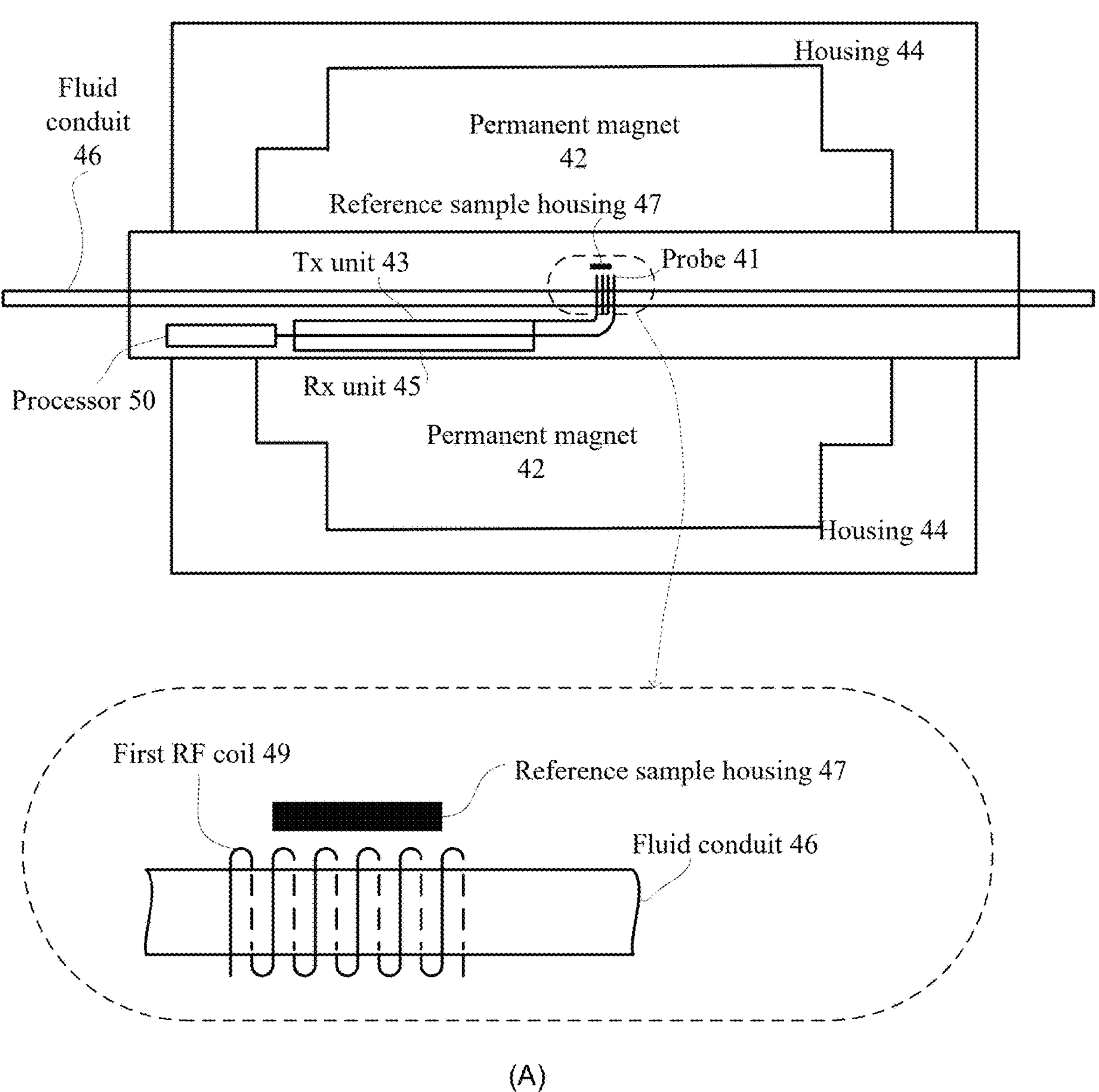
FIG. 4 presents a system diagram of a nuclear magnetic resonance (NMR) measurement system, including key components such as magnets, RF coils, and sample positioning.

FIG. 4 illustrates a system diagram of a nuclear magnetic resonance (NMR) measurement system. The NMR measurement system may include several components arranged to perform NMR measurements on a fluid sample and a reference sample.

In some cases, the NMR measurement system may include a magnet housing 44. The magnet housing 44 may contain a permanent magnet 42. The permanent magnet 42 may be configured to generate a magnetic field within the NMR measurement system.

A measurement probe 41 may be positioned within the magnetic field generated by the permanent magnet 42. The measurement probe 41 may include various components for performing NMR measurements.

In some cases, the NMR measurement system may include a transmission unit 43 and a reception unit 45. The transmission unit 43 and the reception unit 45 may be connected to the measurement probe 41. The transmission unit 43 may be configured to generate and transmit radio frequency signals for NMR excitation, while the reception unit 45 may be configured to receive and process NMR signals from the samples.

A fluid conduit 46 may extend through the NMR measurement system. The fluid conduit 46 may be configured to allow fluid flow through the measurement region, enabling continuous or periodic measurements of the fluid sample.

In some cases, a reference sample housing 47 may be positioned adjacent to the fluid conduit 46. The reference sample housing 47 may be a capillary housing containing a reference sample with a known concentration of the material being measured.

A radio frequency coil 49 may surround the fluid conduit 46. The radio frequency coil 49 may be configured to generate and detect radio frequency signals during NMR measurements. In some cases, the radio frequency coil 49 may be engineered to have a dual or triple resonance response, allowing it to accommodate multiple elements such as Lithium, Boron, or Sodium. This configuration may enable the use of the same probe to determine concentrations of different elements that have a single resonance frequency in their NMR spectra.

The NMR measurement system may include a signal processor 50 connected to the system components. The signal processor 50 may be configured to process measurement data, control the operation of the transmission unit 43 and reception unit 45, and perform concentration calculations based on the NMR spectra obtained from the fluid sample and the reference sample.

In some cases, the arrangement of components in the NMR measurement system may allow for simultaneous measurement of the fluid sample flowing through the fluid conduit 46 and the reference sample in the reference sample housing 47. This configuration may enable the method 10 for production line NMR measurement to be carried out efficiently and accurately.

Figure 5:
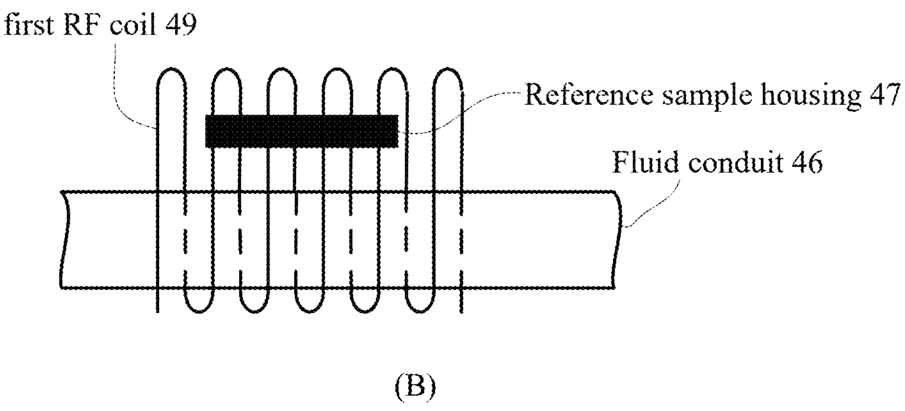
FIG. 5 illustrates two different configurations of one or more radio frequency (RF) coils in relation to the reference sample housing and the fluid conduit in the NMR measurement system.
Figure 5:
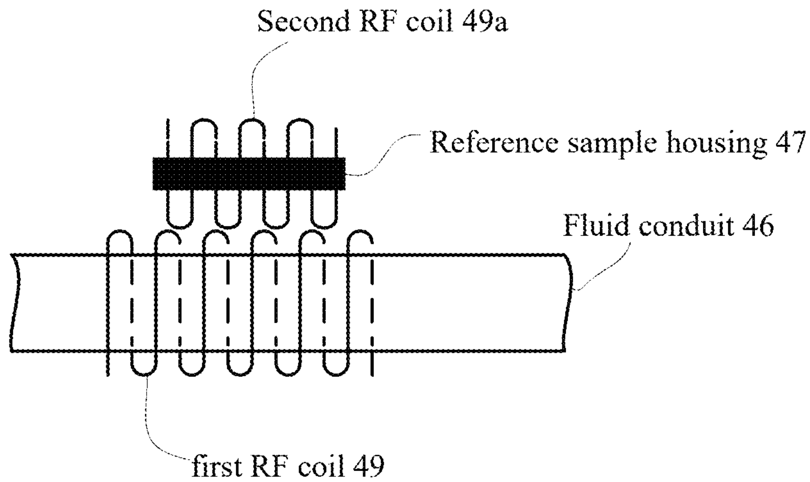

FIG. 5 illustrates two different configurations of radio frequency (RF) coils in relation to the reference sample housing 47 and the fluid conduit 46 in the NMR measurement system.

In some cases, as shown in view (B) of FIG. 5, the reference sample housing 47 and the fluid conduit 46 may be surrounded by a single radio frequency coil 49. This configuration may allow for simultaneous excitation and detection of NMR signals from both the reference sample and the fluid sample using a single RF coil. The single radio frequency coil 49 may be designed to have a sufficiently wide bandwidth to accommodate the slight frequency difference between the signals from the reference sample and the fluid sample.

In other cases, as depicted in view (C) of FIG. 5, the NMR measurement system may employ two separate RF coils. The fluid conduit 46 may be surrounded by the radio frequency coil 49, while a second RF coil 49*a* may surround the reference sample housing 47. This configuration may allow for independent optimization of each RF coil for its respective sample.

The configuration shown in view (B) may offer advantages in terms of simplicity and compactness of the NMR measurement system. Using a single radio frequency coil 49 may reduce the overall complexity of the system and potentially lower manufacturing costs. Additionally, this arrangement may ensure that both the reference sample and the fluid sample experience the same RF field, which may contribute to more consistent measurements.

However, the configuration in view (C) with separate RF coils may provide greater flexibility in optimizing the RF fields for each sample independently. The radio frequency coil 49 surrounding the fluid conduit 46 may be tuned specifically for the fluid sample, while the second RF coil 49*a* may be optimized for the reference sample. This arrangement may allow for better signal-to-noise ratios for each sample and may be particularly beneficial when the reference sample and fluid sample have significantly different NMR properties.

In some cases, the choice between these two configurations may depend on factors such as the specific materials being measured, the required measurement precision, and the overall design constraints of the NMR measurement system. The single-coil configuration may be preferred for applications where simplicity and cost-effectiveness are prioritized, while the dual-coil configuration may be chosen when maximum flexibility and independent optimization of RF fields are desired.

Both configurations may enable the method 10 for production line NMR measurement to be carried out effectively, allowing for accurate concentration determinations of materials with single resonance frequencies by comparing the NMR signals from the reference sample and the fluid sample.

A number of implementations have been described. Nevertheless, it will be understood that various modifications may be made without departing from the spirit and scope of the disclosure. Accordingly, other implementations are within the scope of the following claims.

Because some aspects of the illustrated embodiments of the present disclosure may, for the most part, be implemented using electronic components and circuits known to those skilled in the art, details will not be explained in any greater extent than that considered necessary as illustrated above, for the understanding and appreciation of the underlying concepts of the present invention and in order not to obfuscate or distract from the teachings of the present invention.

Any combination of any steps of any method illustrated in the specification and/or drawings may be provided. Any combination of any subject matter of any of claims may be provided. Any combinations of systems, units, components, processors, sensors, illustrated in the specification and/or drawings may be provided. Any combination of any module or unit listed in any of the figures, any part of the specification and/or any claims may be provided.

Any reference in the specification to a method should be applied mutatis mutandis to a device or system capable of executing the method and/or to a non-transitory computer readable medium that stores instructions for executing the method. Any reference in the specification to a system or device should be applied mutatis mutandis to a method that may be executed by the system, and/or may be applied mutatis mutandis to non-transitory computer readable medium that stores instructions executable by the system.

Any reference in the specification to a non-transitory computer readable medium should be applied mutatis mutandis to a device or system capable of executing instructions stored in the non-transitory computer readable medium and/or may be applied mutatis mutandis to a method for executing the instructions.

In the foregoing specification, the invention has been described with reference to specific examples of embodiments of the invention. It will, however, be evident that various modifications and changes may be made therein without departing from the broader spirit and scope of the invention as set forth in the appended claims. The specifications and drawings are, accordingly, to be regarded in an illustrative rather than in a restrictive sense.

Those skilled in the art will recognize that the boundaries between logic blocks are merely illustrative and that alternative embodiments may merge logic blocks or circuit elements or impose an alternate decomposition of functionality upon various logic blocks or circuit elements. Thus, it is to be understood that the architectures depicted herein are merely exemplary, and that in fact many other architectures may be implemented which achieve the same functionality.

Those skilled in the art will recognize that boundaries between the above-described operations merely illustrative. The multiple operations may be combined into a single operation, a single operation may be distributed in additional operations and operations may be executed at least partially overlapping in time. Moreover, alternative embodiments may include multiple instances of a particular operation, and the order of operations may be altered in various other embodiments.

Any arrangement of components to achieve the same functionality is effectively "associated" such that the desired functionality is achieved. Hence, any two components herein combined to achieve a particular functionality may be seen as "associated with" each other such that the desired functionality is achieved, irrespective of the underlying architecture or intermedial components. Likewise, any two components so associated can also be viewed as being "operably connected," or "operably coupled," to each other to achieve the desired functionality.

It will be appreciated that for simplicity and clarity of illustration, elements shown in the figures have not necessarily been drawn to scale. For example, the dimensions of some of the elements may be exaggerated relative to other elements for clarity. Further, where considered appropriate, reference numerals may be repeated among the figures to indicate corresponding or analogous elements.

In the claims, any reference signs placed between parentheses shall not be construed as limiting the claim. The word 'comprising' does not exclude the presence of other elements or steps then those listed in a claim. Furthermore, the terms "a" or "an," as used herein, are defined as one or more than one. Also, the use of introductory phrases such as "at least one" and "one or more" in the claims should not be construed to imply that the introduction of another claim element by the indefinite articles "a" or "an" limits any particular claim containing such introduced claim element to inventions containing only one such element, even when the same claim includes the introductory phrases "one or more" or "at least one" and indefinite articles such as "a" or "an." The same holds true for the use of definite articles. Unless stated otherwise, terms such as "first" and "second" are used to arbitrarily distinguish between the elements such terms describe. Thus, these terms are not necessarily intended to indicate temporal or other prioritization of such elements. The mere fact that certain measures are recited in mutually different claims does not indicate that a combination of these measures cannot be used to advantage.

It is appreciated that various features of the embodiments of the disclosure which are, for clarity, described in the contexts of separate embodiments may also be provided in combination in a single embodiment. Conversely, various features of the embodiments of the disclosure which are, for brevity, described in the context of a single embodiment may also be provided separately or in any suitable sub-combination.

It will be appreciated by persons skilled in the art that the embodiments of the disclosure are not limited by what has been particularly shown and described hereinabove. Thus, the scope of the embodiments of the disclosure is defined by the appended claims and equivalents thereof. While certain features of the disclosure have been illustrated and described herein, many modifications, substitutions, changes, and equivalents will now occur to those of ordinary skill in the art. It is therefore to be understood that the appended claims are intended to cover all such modifications and changes as fall within the true spirit of the invention.

The invention claimed is:

1. A method for production line nuclear magnetic resonance (NMR) measurement of a fluid comprising a material having a single resonance frequency, the method comprising:

positioning a reference sample comprising the material and a sample of the fluid within a sensing region of an NMR measurement unit coil of a production line NMR measurement device, and within a magnetic field of a permanent magnet of the production line NMR measurement device, wherein a concentration of the material within the reference sample is of a known value;

performing an NMR measurement comprising feeding at least one radio frequency coil of the production line NMR measurement device with a signal having a spectrum that comprises a characteristic frequency of a nucleus of the material, and generating detection signals indicative of sensed radio frequency emissions associated with the reference sample and the sample of the fluid;

processing the detection signals to provide an NMR spectrum comprising a first peak associated with the material within the reference sample and a second peak associated with the material within the fluid; and determining a concentration of the material within the fluid based on a relationship between an attribute of the first peak, an attribute of the second peak and the known value.

2. A system for production line nuclear magnetic resonance (NMR) measurement of a fluid comprising a material having a single resonance frequency, the system comprising:

a permanent magnet configured to generate a magnetic field;

an NMR measurement unit coil positioned within the magnetic field;

a reference sample housing configured to hold a reference sample comprising the material at a known concentration;

a fluid conduit configured to hold a sample of the fluid;

at least one radio frequency coil; and a processor configured to:

control the at least one radio frequency coil to perform an NMR measurement, process detection signals to provide an NMR spectrum comprising a first peak associated with the material within the reference sample and a second peak associated with the material within the fluid, and determine a concentration of the material within the fluid based on a relationship between an attribute of the first peak, an attribute of the second peak and the known concentration.

3. A non-transitory computer-readable medium storing instructions that, when executed by a processor, cause the processor to perform a method for production line nuclear magnetic resonance (NMR) measurement of a fluid comprising a material having a single resonance frequency, the method comprising:

positioning a reference sample comprising the material and a sample of the fluid within a sensing region of an NMR measurement unit coil of a production line NMR measurement device, and within a magnetic field of a permanent magnet of the production line NMR measurement device, wherein a concentration of the material within the reference sample is of a known value;

performing an NMR measurement comprising feeding at least one radio frequency coil of the production line NMR measurement device with a signal having a spectrum that comprises a characteristic frequency of a nucleus of the material, and generating detection signals indicative of sensed radio frequency emissions associated with the reference sample and the sample of the fluid;

processing the detection signals to provide an NMR spectrum comprising a first peak associated with the material within the reference sample and a second peak associated with the material within the fluid; and determining a concentration of the material within the fluid based on a relationship between an attribute of the first peak, an attribute of the second peak and the known value.

4. The method of claim 1, wherein the reference sample is positioned within a reference sample housing.

5. The method of claim 1, wherein the reference sample and a fluid conduit that holds the fluid sample are surrounded by a single radio frequency coil of the at least one radio frequency coil.

6. The method of claim 1, wherein the at least one radio frequency coil comprises a first radio frequency coil that surrounds a fluid conduit holding the fluid sample and a second radio frequency coil that surrounds the reference sample.

7. The method of claim 1, wherein the attribute of the first peak is an area associated with the first peak, and the attribute of the second peak is an area associated with the second peak.

8. The system of claim 2, wherein the reference sample housing is a capillary housing.

9. The system of claim 2, wherein the at least one radio frequency coil comprises a single radio frequency coil that surrounds both the reference sample housing and the fluid conduit.

10. The system of claim 2, wherein the at least one radio frequency coil comprises a first radio frequency coil that surrounds the fluid conduit and a second radio frequency coil that surrounds the reference sample housing.

11. The system of claim 2, wherein the attribute of the first peak is an area associated with the first peak, and the attribute of the second peak is an area associated with the second peak.

12. The system of claim 2, wherein the material having a single resonance frequency is selected from the group consisting of lithium, boron, and sodium.

13. The non-transitory computer-readable medium of claim 3, wherein the reference sample is positioned within a reference sample housing.

14. The non-transitory computer-readable medium of claim 3, wherein the reference sample and a fluid conduit that holds the fluid sample are surrounded by a single radio frequency coil of the at least one radio frequency coil.

15. The non-transitory computer-readable medium of claim 3, wherein the at least one radio frequency coil comprises a first radio frequency coil that surrounds a fluid conduit holding the fluid sample and a second radio frequency coil that surrounds the reference sample.

16. The non-transitory computer-readable medium of claim 3, wherein the attribute of the first peak is an area associated with the first peak, and the attribute of the second peak is an area associated with the second peak.

17. The method of claim 4, wherein the reference sample housing is a capillary housing.

18. The method of claim 7, wherein determining the concentration comprises multiplying the known value by a ratio between the area of the second peak and the area of the first peak.

19. The system of claim 11, wherein the processor is configured to determine the concentration by multiplying the known concentration by a ratio between the area of the second peak and the area of the first peak.

20. The non-transitory computer-readable medium of claim 13, wherein the reference sample housing is a capillary housing.

* * * * *